United States Patent [19]

Watanabe et al.

[11] Patent Number: 5,963,502
[45] Date of Patent: Oct. 5, 1999

[54] CLOCK-SYNCHRONOUS TYPE SEMICONDUCTOR MEMORY DEVICE CAPABLE OF OUTPUTTING READ CLOCK SIGNAL AT CORRECT TIMING

[75] Inventors: Naoya Watanabe; Yoshikazu Morooka; Tsutomu Yoshimura; Yasunobu Nakase, all of Hyogo, Japan

[73] Assignee: Mitsubishi Denki Kabushiki Kaisha, Tokyo, Japan

[21] Appl. No.: 09/112,439

[22] Filed: Jul. 9, 1998

[30] Foreign Application Priority Data

Jan. 14, 1998 [JP] Japan .................................. 10-005386

[51] Int. Cl.$^6$ ........................................................ G11C 7/00
[52] U.S. Cl. ........................... 365/233; 365/194; 327/141; 327/147; 327/153
[58] Field of Search ..................................... 365/233, 194; 327/161, 141, 146, 147, 153, 156

[56] References Cited

U.S. PATENT DOCUMENTS 5,708,611  1/1998  Iwamoto et al. .......................... 365/195
5,754,490  5/1998  Harrison et al. ......................... 365/233
5,831,929  11/1998  Manning .................................. 365/233

FOREIGN PATENT DOCUMENTS 9-008617  1/1997  Japan .

OTHER PUBLICATIONS

"400 Mb/s/pin SLDRAM", 1997, SLDRAM Consortium, pp. 1–59.

*Primary Examiner*—Vu A. Le
*Attorney, Agent, or Firm*—McDermott, Will & Emery

[57] ABSTRACT

A voltage controlled delay circuit having the same structure, except for a loop, as a voltage controlled oscillator included in a PLL circuit which in turn generates an internal clock signal from an external clock signal is controlled by a control voltage from the PLL circuit, and the delay output of the voltage controlled delay circuit is selected by a selection circuit in accordance with the output signal of a vernier-adjusting counter in order to generate a read clock signal. Therefore, a vernier for optimizing data input timing in a controller can be realized which always has a constant delay amount regardless of a change in operating environment.

9 Claims, 12 Drawing Sheets

5,963,502

CLOCK-SYNCHRONOUS TYPE SEMICONDUCTOR MEMORY DEVICE CAPABLE OF OUTPUTTING READ CLOCK SIGNAL AT CORRECT TIMING

BACKGROUND OF THE INVENTION

1. Field of the Invention

The present invention relates to a synchronous type semiconductor memory device operating in synchronization with an external clock signal and more particularly to a synchronous type semiconductor memory device outputting both of data and a read clock signal which determines timing for sampling the data. More specifically, the present invention relates to a circuit for adjusting timing for outputting a read clock signal which in turn is output at the time of data reading.

2. Description of the Background Art

In order to transfer data at high speed in accordance with the high speed operation of a processor, a synchronous type semiconductor memory device which inputs/outputs data in synchronization with an external clock signal such as a system clock has been used extensively as a main memory. One of such synchronous type semiconductor memory devices is a sync link DRAM (SLDRAM: Sync Link Dynamic Random Access Memory).

FIG. 10 shows an example of the structure of a memory system in which the sync link DRAMs are used. In FIG. 10, the memory system includes eight sync link DRAMs S#0–S#7 and a controller 900 for controlling access to these sync link DRAMs S#0–S#7.

Sync link DRAMs S#0–S#7 are commonly coupled to a control clock line 902 transmitting a control clock signal CCLK supplied from controller 900, a command/address bus 904 transmitting a command designating an operation mode and an address indicating a memory location to be accessed, a data clock line 906 transmitting a data clock signal DCLK which provides timing for writing/reading of data, and a data bus 908 transmitting write/read data. Control clock line 902 and command/address bus 904 are unidirectional buses which transmit control clock signal CCLK and the command/address which in turn are output from controller 900 in one direction. On the other hand, data clock line 906 and data bus 908 are bi-directional buses which transmit data clock signal DCLK and data bi-directionally between controller 900 and sync link DRAMs S#0–S#7.

Sync link DRAMs S#0–S#7 are identified by an identifier called a slave ID. In a sync link DRAM designated by the slave ID transmitted on command/address bus 904 from controller 900, an operation designated by a command is performed. A data reading operation in the memory system shown in FIG. 10 will now be described with reference to a timing chart shown in FIG. 11.

At the time of data reading, in synchronization with clock signal CCLK supplied to control clock line 902, controller 900 provides a command in a packet form instructing data reading to command/address bus 904. The read request command also includes a slave ID specifying a sync link DRAM, and the sync link DRAM designated by the slave ID takes in a command applied on command/address bus 904 at both of the rising and falling edges of control clock signal CCLK. In the designated sync link DRAM, data is read and, after prescribed latency, read clock signal DCLK and data D0 are output to data bus 908.

The data appeared on data bus 908 changes in synchronization with the both rising and falling edges of read clock signal DCLK, and eight data D0–D7 are successively output over clock cycles #7–#10. The time period required from application of a read request command to actual reading of data is called "read latency", and the number of data successively read by one command is called "burst length". Read clock signal DCLK (used likewise during writing as well) on clock signal line 906 is at a high impedance state in a standby cycle. Before data reading, the designated sync link DRAM once lowers read clock signal DCLK to the low level and then activates read clock signal DCLK in a cycle preceding by one cycle clock cycle in which data is actually read out.

Read clock signal DCLK is generated based on control clock signal CCLK, and controller 900 samples data appeared on data bus 908 in accordance with read clock signal DCLK. Since the distance from controller 900 is different for each sync link DRAM, the timing for generating read clock signal DCLK is shifted in accordance with the distance from controller 900, in order to equalize the time from application of a read command to actual arrival of read data for each sync link DRAM. The read latency is designated on the basis of a half cycle of control clock signal CCLK. With respect to the delay amount of read clock signal DCLK, the delay amount relative to control clock signal CCLK is determined by a command called a "read data vernier", and the offset between read clock signal DCLK and data is also given from a data offset vernier. By once setting read clock signal DCLK at the L level, a data sampling edge can be adjusted in its head cycle in controller 900.

By transferring data in synchronization with the rising and falling edges of clock signal DCLK as shown in FIG. 11, data can be transferred at high speed.

FIG. 12 schematically shows a structure of the data input portion of controller 900. In FIG. 12, the input portion of controller 900 includes a delay circuit 910 delaying read clock signal DCLK on clock signal line 906 by a prescribed time period, an input buffer 912 receiving data D supplied on data bus 908 at the rising and falling edges of a delayed clock signal DCLK_D from delay circuit 910, and a data S/P (Serial/Parallel) converter 914 converting data on an internal high speed bus intData_F from input buffer 912 to parallel data in accordance with control clock signal CCLK for transmission to low speed data buses intData<0> and intData<1>. When the frequency of an external interface is high, the internal portion of the controller usually operates in accordance with a frequency-divided clock signal of control clock signal CCLK. Especially, since data is transferred at the frequency twice as high as control clock signal CCLK, the data transfer frequency is halved by data S/P converter 914 to operate internal circuitry at the frequency of control clock signal CCLK.

FIG. 13 shows one example of the structure of the input buffer shown in FIG. 12. In FIG. 13, input buffer 912 includes an inverter 912a inverting delayed clock signal DCLK_D, a transfer gate 912b formed of an n channel MOS transistor rendered conductive to allow data D to pass therethrough when the output signal of inverter 912a is at the H level, an inverter latch 912c latching the data received from transfer gate 912b, an inverter 912i inverting the latched data of inverter latch 912c, a transfer gate 912d formed of an n channel MOS transistor rendered conductive to allow the output signal of inverter 912i to pass therethrough when delayed clock signal DCLK_D is at the H level, a transfer gate 912e formed of an n channel MOS transistor rendered conductive to allow data D to pass therethrough when delayed clock signal DCLK_D is at the H level, an inverter latch 912f latching the data received from transfer gate 912e, an inverter 912g inverting the latched data of inverter latch 912f, and a transfer gate 912h formed of an n channel MOS transistor rendered conductive to transmit the output signal of inverter 912g to internal high speed data bus intData_F when the output signal of inverter 912a is at the H level.

In the structure of input buffer 912 shown in FIG. 13, when one inverter latch latches external data, the other inverter latch transmits the latched data to internal high speed data bus intData_F. Therefore, inverter latches 912c and 912f alternately perform the latching operation at each of H and L levels of delayed clock signal DCLK_D. Thus, different data is transmitted to internal high speed data bus intData_F each time delayed clock signal DCLK_D changes.

FIG. 14 shows one example of the structure of data S/P converter 914 shown in FIG. 12. In FIG. 14, data S/P converter 914 includes an inverter 914a inverting control clock signal CCLK, a transfer gate 914b formed of an n channel MOS transistor rendered conductive to allow data on internal high speed data bus intData_F to pass therethrough when the output signal of inverter 914a is at the H level, an inverter latch 914c latching the data received from transfer gate 914b, a transfer gate 914d formed of an n channel MOS transistor rendered conductive to allow the latched data of inverter latch 914c to pass therethrough when control clock signal CCLK is at the H level, an inverter latch 914e transmitting the data received through transfer gate 914d to a first internal low speed data bus intData<0>, a transfer gate 914f formed of an n channel MOS transistor rendered conductive to allow the data on internal high speed data bus intData_F to pass therethrough when control clock signal CCLK is at the H level, an inverter latch 914g latching the data received through transfer gate 914f, a transfer gate 914h formed of an n channel MOS transistor rendered conductive to allow the latched data of inverter latch 914g to pass therethrough when the output signal of inverter 914a is at the H level, and an inverter latch 914i latching the data received from transfer gate 914h and transmitting it to a second internal low speed data bus intData<1>.

In data S/P converter 914 shown in FIG. 14, new data is transmitted in each clock cycle of control signal CCLK to internal low speed data buses intData<0> and intData<1>. In data S/P converter 914, the speed of transferring internal data is that of half the frequency of control signal CCLK. However, conversion into divided-by-three or more frequency of the control clock signal may be performed. Then, the operation of a control data input portion shown in FIGS. 12–14 will be described with reference to a timing chart shown in FIG. 15.

As shown in FIG. 15, the phases of control clock signal CCLK and read clock signal DCLK which is output from the sync link DRAM are shifted from each other. Such shifting is caused by the propagation delay of a signal on the read clock signal line because data is transferred through data bus 908 and read clock signal DCLK is also transmitted through clock signal line 906. Read clock signal DCLK and data D are transferred in synchronization, that is, in phase with each other (when the data offset vernier is set at 0).

Delay circuit 910 shown in FIG. 12 delays read clock signal DCLK by a prescribed time period to generate delayed clock signal DCLK_D. In accordance with delayed clock signal DCLK_D, data transmitted from a sync link DRAM is taken in, latched, and transferred to the internal data bus. When delayed clock signal DCLK_D is at the H level, transfer gates 912d and 912e are conductive and transfer gates 912b and 912h are non-conductive in the input buffer shown in FIG. 13. Therefore, data D0 latched by inverter latch 912c is transmitted to internal high speed data bus intData_F when delayed clock signal DCLK_D is at the L level. At this time, inverter latch 912f takes in the next data. Therefore, data D0, D1, D2 and D3 are successively output to internal high speed data bus intData_F each time delayed clock signal DCLK_D changes.

Data S/P converter 914 operates in synchronization with control clock signal CCLK. In data S/P converter 914, data latched by inverter latch 914c is transmitted to internal low speed data bus intData<0> and data on internal low speed data bus intData<1> is latched when control clock signal CCLK is at the H level. When control clock signal CCLK attains the L level, the data on internal low speed data bus intData<0> is latched and new data is transmitted onto internal low speed data bus intData<1>. To internal low speed data buses intData<0> and intData<1>, data is alternately transmitted in each clock cycle of control clock signal CCLK. Thus, the data transmitted at the speed twice as high as control clock signal CCLK can be converted into those at the speed of control clock signal CCLK. Controller 900 operates in synchronization with control clock signal CCLK. Therefore, data transfer in accordance with the operation speed of a controller can be implemented.

FIG. 16 shows timing for reading data of each sync link DRAM in the sync link DRAM memory system shown in FIG. 10. As shown in FIG. 10, the distance from the controller is different for each sync link DRAM in the memory system. When the controller outputs a command, therefore, the time required for read clock signal DCLK and read data to arrive at the controller is different for a different addressed sync link DRAM. Read clock signal DCLK and data from sync link DRAM<0>(S#0) which is arranged closest to the controller arrives at the controller first. Read clock signal DCLK from a sync link DRAM<1>(S#1) which is adjacent to sync link DRAM<0> delays by time d1 from the read clock from sync link DRAM<0>. The read clock signal from a sync link DRAM<7>(S#7) which is arranged farthest from the controller arrives much later.

As shown in FIG. 16, read clock signal DCLK from sync link DRAM<7> arrives delayed by time d2 relative to read clock signal DCLK from sync link DRAM<0>. The read latency is defined on the basis of a half cycle of control clock signal CCLK. Even if the read latency is the same, therefore, the time from application of a command from the controller to actual arrival of the read clock signal and data is different. Accordingly, a data input error as described below is caused in the controller.

FIG. 17 shows operation timings where there is a data input error. In FIG. 17, an operation is represented where the propagation delay of the data bus and the read clock signal line is large and the phase difference between read clock signal DCLK and control clock signal CCLK is made small. In the controller, read clock signal DCLK is delayed to generate delayed clock signal DCLK_D. When the delay by the delay circuit is larger than the delay time corresponding to the phase difference between read clock signal DCLK and control clock signal CCLK, the rising timing of delayed clock signal DCLK_D is delayed from the rising timing of control clock signal CCLK.

Read clock signal DCLK and data are output at the same timing. To internal high speed data bus intData_F, valid data D0 is initially output from input buffer 912 when control clock signal CCLK is raised. Therefore, data S/P converter 914 performs a latching operation in synchronization with a rising of control clock signal CCLK and transmits invalid data to internal low speed data bus intData<0>. The first valid data D0 is transmitted to another internal low speed data bus intData<1>. Thus, data D1 and D3 are transmitted to internal low speed data bus intData<0>, and data D0 and D2 are transmitted to internal low speed data bus intData<1>. In the controller, therefore, even numbered data and odd numbered data are reversely processed, resulting in an incorrect processing.

In order to prevent an error in transferring data which is caused by the influence of data propagation delay due to the distance from the controller to a sync link DRAM so that data can arrive at the controller at the same timing whichever sync link DRAM is accessed, it has been proposed to perform adjustment of the output delay called "vernier control" at the time of initialization.

The "vernier control" is adjustment of the output timing of each sync link DRAM by sending a vernier control command to the sync link DRAM at the time of initialization so as to achieve the timing at which the controller can input data correctly. After the controller sets the slave ID of each sync link DRAM, and then sets the H and L voltage levels of each output signal as well as an operating frequency, a read timing synchronization sequence for the vernier control is performed. In the read timing synchronization sequence, when the controller provides a read synchronization request command to a sync link DRAM, each sync link DRAM sends a data pattern having a known-pattern back to the controller. When the controller sends out the synchronization request command, it repeatedly sends out the synchronization request commands until a known data pattern is sent back and received at optimum timing. In the sync link DRAM, in this sequence, by using the count value of a built-in counter the delay of data outputting with respect to the control clock signal is increased or reduced on the basis of a unit amount in accordance with a command applied from the controller. Thus, the timing for outputting data is finely adjusted.

FIG. 18 schematically shows a structure of the data output portion of the sync link DRAM. In FIG. 18, the output portion of the sync link DRAM includes a vernier 950 changing the delay amount of an internal clock signal CLK_O generated at the time of data reading and generating a vernier clock signal VCLK_O in accordance with an externally applied increment/decrement command UP/DOWN, output buffers OB0–OB7 receiving internal read data intD<0>–intD<7> and outputting them in parallel to data buses <0>–<7> in synchronization with vernier clock signal VCL_O, and a DCLK output buffer COB buffering vernier clock signal VCLK_O and outputting read clock signal DCLK. Here, the structure in which the data bus has a width of 8 bits, and eight output buffers are provided in parallel is shown as one example.

Vernier 950 changes the delay amount with respect to clock signal CLK_O in accordance with externally applied increment/decrement command UP/DOWN. Now, the operation of the output portion shown in FIG. 18 will be described with reference to a flow chart shown in FIG. 19A and a timing chart shown in FIG. 19B.

First, as shown in FIG. 19A, a read sync request command is sent out from the controller to a corresponding sync link DRAM in order to set read timing (step S1). The read sync request command instructs the sync link DRAM of interest to output data having a prescribed pattern. The sync link DRAM sends the prescribed synchronization pattern to the controller in accordance with the read sync request command. The controller activates the internal synchronization circuit when it sends the read sync request command, and determines whether the synchronization pattern is received or not based on reception of the prescribed data pattern (step S2). When the synchronization pattern is received, the controller then determines whether the timing for reception is optimum (step S3). The determination is made based, for example, on whether control clock signal CCLK changes at the center of a bit. When the controller determines that the timing for reception is not optimum, it determines whether the timing is advanced or lagged (step S4) and, based on the result of the determination, sends a command instructing the increment or decrement of the vernier (count value) to the corresponding sync link DRAM (step S5).

As shown in FIG. 19B, in the sync link DRAM, the delay amount of vernier 950 is updated in accordance with the increment/decrement command to adjust the phase difference between clock signal CLK_O and vernier clock signal VCLK_O. Then, the operation from step 1 is repeated. When the timing for reception is determined to be optimum at step S3, the operation for adjusting the read timing is completed.

As a result of vernier adjustment, as shown in FIG. 19B, control clock signal CCLK changes almost at the center of delayed clock signal DCLK_D, and data D0, D1, D3 . . . on internal high speed data bus intData_F are received and successively transferred to internal low speed data buses intData<O> and intData<1> in the controller. Therefore, even when the distance from the controller is different for each sync link DRAM, an optimum delay amount (fine read vernier) is set for each sync link DRAM and correct data reception is achieved in the controller.

Various specifications have been made for the sync link DRAM. With respect to adjustment of a data read vernier, however, adjustment of the timing for clock generation by increasing and decreasing the count value of a built-in counter of the sync link DRAM has only been described. A specific circuit example has not been described.

FIG. 20A shows one possible example of a circuit for adjusting the phase of a clock signal by using such a counter. In FIG. 20A, vernier circuit 950 includes a delay circuit DLC formed of cascaded inverters of 2 m stages for delaying clock signal CLK_O, a counter 955 having its count value increased and decreased in accordance with an increment command UP and a decrement command DOWN, and a selection circuit ST selecting the output of delay circuit DLC in accordance with the output count value of counter 955.

Delay circuit DLC includes delay stages DL1–DLm each having cascaded inverters of two stages. Counter 955 has output count bits C[0]–C[m] corresponding to the inputs and the outputs of delay stages DL1–DLm. In counter 955, the count value is initialized in accordance with reset signal ZRST.

Selection circuit ST includes transfer gates T<0>–T<m> provided corresponding to delay stages DL1–DLm of delay circuit DLC and each formed, for example, of an n channel MOS transistor for selecting the output of a corresponding delay stage or input clock signal CLK_O in response to a corresponding one of output count bits C[0]–C[m] of counter 955. Only one of output count bits C[0]–C[m] is activated in counter 955 and only one corresponding transfer gate is rendered conductive in selection circuit ST, so that a corresponding delayed clock signal or input clock signal CLK_O is selected from delay circuit DLC to output vernier clock signal VCLK_O. In the structure shown in FIG. 20A, the phase of clock signal CLK_O can be adjusted by the step of the delay time of delay stages DL1–DLm.

FIG. 20B shows a structure of counter 955 shown in FIG. 20A. In FIG. 20B, counter 955 has count circuits CTR0–CTRm provided corresponding to count bits C[0]–C[m]. Count circuit CRT0 includes an inverter 956, an NAND circuit 957 receiving the output signal of inverter 956 and a reset instruction ZRST and supplying the output to inverter 956, a transfer gate 958 formed of an n channel MOS transistor rendered conductive to transfer the output signal S[0] of inverter 956 in response to a transfer instruction signal T0, an inverter latch 959 latching a signal transmitted by transfer gate 958, and a transfer gate 960 formed of an n channel MOS transistor transmitting count bit C[0] latched by inverter latch 959 to a count circuit CTR1 at the next stage in accordance with decrement command DOWN. The input of inverter 956 is reset at a ground voltage GND (logic 0) by an n channel MOS transistor 961 which is rendered conductive in response to decrement command DOWN.

Since count circuits CTR1–CTRm-1 have the same structure, count circuit CTR1 is representatively shown in FIG. 20B. Count circuit CTR1 includes an inverter 963, an NAND circuit 962 receiving reset instruction signal ZRST and the output signal of inverter 963 and supplying the output to inverter 963, a transfer gate 964 rendered conductive to transmit the output signal of NAND circuit 962 in response to transfer instruction signal T0, an inverter latch 965 latching data transferred by transfer gate 964, a transfer gate 966 transmitting data C[1] latched by inverter latch 965 to a count circuit CTR2 at the next stage in response to activation of decrement command DOWN, and a transfer gate 967 rendered conductive to send count bit C[1] latched by inverter latch 965 back to the input portion of count circuit CTR0 at a previous stage in response to activation of increment command UP.

Count circuit CTRm at the last stage includes an NAND circuit 971 receiving data transferred by count circuit CTRm-1 (not shown) at the previous stage and reset instruction signal ZRST, an inverter 972 receiving the output signal S[m] of NAND circuit 971 for transference to the input of NAND circuit 971, a transfer gate 973 rendered conductive to transfer the output signal of NAND circuit 971 in response to activation of transfer instruction signal T0, an inverter latch 974 latching data transferred by transfer gate 973 and outputting count bit C[m], and a transfer gate 975 rendered conductive to send count bit C[m] latched by inverter latch 974 back to the input portion of count circuit CTRm-1 at the previous stage in response to activation of increment command UP. Since a count circuit does not exist at the next stage, count circuit CTRm at the last stage is not provided with a transfer gate responsive to decrement command DOWN.

FIG. 20C shows a structure of a circuit for generating transfer instruction signal T0. The transfer instruction signal generation portion includes an NOR circuit 980 receiving decrement command DOWN and increment command UP. When the increment or decrement operation is performed, transfer instruction signal T0 attains the L level inactive state and a count bit supplied from the count circuit at the previous stage is taken in and latched. Now, the operation of vernier circuit 950 shown in FIGS. 20A–20C will be described with reference to a timing chart shown in FIG. 21.

At time t0, a vernier setting operation is designated and reset signal ZRST is set at the L level for a prescribed time period. In response to a fall of reset signal ZRST, the output signal of NAND circuit 957 attains the H level and accordingly the output signal of inverter 956 attains the L level in count circuit CTR0. Therefore, an internal signal S[0] is initialized to the L level. Since increment command UP and decrement command DOWN are both at the L level, transfer instruction signal T0 is at the H level, transfer gate 958 is rendered conductive, and count bit C[0] latched by inverter latch 959 is set at the H level (logic "1"). In the remaining count circuits CTR1–CTRm, output signals S[1]–S[m] of NAND circuits 962 and 971 attain the H level in response to a fall of reset instruction signal ZRST to the L level, and count bits C[1]–C[m] latched by inverter latches 965 and 974 are set at the L level (logic "0").

By the operation above, initialization is performed and only count bit C[0] keeps its active state. In this state, only transfer gate T<0> shown in FIG. 20A is rendered conductive and read clock signal CLK_O is selected as vernier clock signal VCLK_O.

At time t1, decrement command DOWN is activated, transfer gates 961, 960, 966 are rendered conductive, and the shift operation of the count bits corresponding to count circuits CTR0–CTRm is performed. While decrement command DOWN is at the H level, transfer instruction signal T0 is at the L level. Thus, transfer gates 958, 964 and 973 are all non-conductive and count bits C[0]–C[m] do not change. By this transfer operation, output signal S[1] of NAND circuit 962 is lowered from the H level to the L level in count circuit CTR1 (reset signal ZRST is at the H level non-active state), and internal signals S[i] of remaining count circuits CTR2–CTRm all keep the H level. In count circuit CTR0 at the first stage transistor 961 is rendered conductive and ground voltage GND is transmitted, and internal signal S[0] is lowered to the H level.

When decrement command DOWN is lowered to the L level at time t2, transfer gates 958, 964 and 973 are rendered conductive in count circuits CTR0–CTRm, so that internal signals are transferred and the count bits are updated. In this case, count bit C[0] is lowered from logic 1 to logic 0. On the other hand, in count circuit CTR1, L level signal S[l] is latched by inverter latch 965 and count bit C[1] is raised to logic 1. The count bits are not changed in remaining count circuits CTR2–CTRm. In this state, only transfer gate T<1> shown in FIG. 20A is rendered conductive and the output signal of delay stage DL1 is selected as vernier clock signal VCLK_O.

At time t3, decrement command DOWN attains the H level active state again, and the internal transfer operation of the count bit is performed. In this case, the internal signal of count circuit CTR2 is at the L level while internal signals S[i] of remaining count circuits are at the H level.

When decrement command DOWN is lowered to the L level at time t4, transfer instruction signal T0 attains the H level and transfer gates 958, 964 and 973 are rendered conductive to transfer the internal signals to corresponding inverter latches. In this case, count bit C[2] changes to the H level (logic 1) while remaining count bits C[0] and C[2]–C[m] keep the L level (logic 0). In this case, transfer gate T<2> shown in FIG. 20A is rendered conductive and the output signal of delay stage DL2 is selected as vernier clock signal VCLK_O.

At time t5, increment command UP rises to the H level and accordingly transfer instruction signal T0 attains the L level. In this case, the data latched by the inverter latch of each count circuit is transferred to the input portion of the count circuit at the previous stage. Therefore, count bit C[2] of count circuit CTR2 is transferred to the input portion of count circuit CTR1, and internal signal S[1] is lowered to the L level. Meanwhile, in count circuit CTR2, internal signal S[2] is raised to the H level by a feedback signal from count circuit CTR3 (not shown).

When increment command UP attains the L level at time t6, transfer instruction signal T0 attains the H level and the signal taken in inside is transferred to the inverter latch. In this case, only internal signal S[1] of count circuit CTR1 is at the L level and the internal signals of remaining count circuits CTR0 and CTR2–CTRm are at the H level. Therefore, in response to the fall of increment command UP at time t6, count bit C[1] is raised to the H level (logic 1) and count bit C[2] changes to the L level (logic 0). In this case, transfer gate T<1> shown in FIG. 20A is rendered conductive again and the output signal of delay stage DL1 is selected as vernier clock signal VCLK_O.

In the case of the vernier circuit shown in FIGS. 20A–20C, the delay time of a clock signal can be adjusted with the delay time caused by inverters of two stages used as a minimum unit.

In other words, in the vernier circuit shown in FIGS. 20A–20C, application of command UP shortens the delay time of vernier clock signal VCLK_O while application of command DOWN lengthens the delay time of vernier clock signal VCLK_O. In the controller, applied data can correctly and selectively be transferred to internal data buses intData<0> and intData<1> by timing adjustment.

FIG. 22 shows a structure of an inverter included in delay circuit DLC. In FIG. 22, the inverter includes a p channel MOS transistor PQ rendered conductive to drive an output signal OUT to a power supply voltage VDD level when an input signal IN is at the L level, and an n channel MOS transistor NQ rendered conductive to discharge output signal OUT to the ground voltage GND level when input signal IN is at the H level. With such MOS transistors, when power supply voltage VDD becomes higher, the source voltage of MOS transistor PQ is accordingly raised, increasing the amount of driving current of MOS transistor PQ and allowing the rise of output signal OUT at high speed. When the internal power supply voltage becomes higher, the H level of input signal IN is raised. Therefore, the gate voltage of MOS transistor NQ is raised and accordingly the amount of driving current of MOS transistor NQ is increased. On the contrary, when the internal power supply voltage is lowered, the current drivability of MOS transistors PQ and NQ is reduced, lowering the transition speed of output signal OUT.

Further, when operating temperature is raised, hot electrons are generated in an MOS transistor and collision of electric charges is caused in the channel region, so that the channel resistance is increased equivalently. Therefore, higher operating temperature lowers the transition speed of output signal OUT.

Therefore, in the case of a structure in which a delay circuit is formed of an inverter and the output of the delay circuit is selected, the delay time of each output stage changes in accordance with changes in an operating power supply voltage and operating temperature. Vernier setting is performed at the time of initialization but will not be performed during the operation thereafter. Therefore, it is necessary to power up the system again by resetting the system in order to carry out a resetting. Thus, when the operating power supply voltage and operating temperature of each sync link DRAM change during the operation, the value of the read vernier which is initially set changes and the controller cannot input data at correct timing. Accordingly, internal data transfer cannot be performed correctly.

SUMMARY OF THE INVENTION

An object of the present invention is to provide a semiconductor memory device with which a memory system can be implemented allowing a controller to input/output data at correct timing regardless of a change in operating environment.

Another object of the present invention is to provide a synchronous type semiconductor memory device in which a vernier which is set once will not change even when the operating environment changes.

Still another object of the present invention is to provide a synchronous type semiconductor memory device including a vernier circuit in which delay time is always constant regardless of fluctuations of an operation power supply voltage and operating temperature.

A synchronous type semiconductor memory device according to the invention includes a phase synchronization circuit for generating an internal clock signal in phase with an externally supplied external clock signal. The phase synchronization circuit includes a voltage controlled oscillator having a feedback loop from an output portion to an input portion and having an oscillating frequency controlled by a control voltage which corresponds to a phase difference between the external and internal clock signals.

The synchronous type semiconductor memory device according to the present invention further includes a read clock generator for generating a read clock signal from the internal clock signal and outputting it to an outside at the time of data reading. The read clock generator has a variable delay circuit having the same structure as the voltage controlled oscillator except for the feedback loop and receiving a signal corresponding to the internal clock signal at its input.

The synchronous type semiconductor memory device according to the invention further includes a vernier setting circuit for setting the delay amount of the variable delay circuit in accordance with an external command.

The variable delay circuit which has the same structure as the voltage controlled oscillator of the phase synchronization circuit which in turn generates the internal clock signal is used as a delay circuit for setting a vernier. Even if there is a change in the power supply voltage and the operating temperature, a similar change is caused in the phase synchronization circuit and the phases of the internal and external clock signals are synchronized. The delay amount of the variable delay circuit is also adjusted in accordance with the control voltage for synchronizing the phases. Therefore, the unit delay amount of the variable delay circuit is always constant and the vernier which is set is maintained stably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
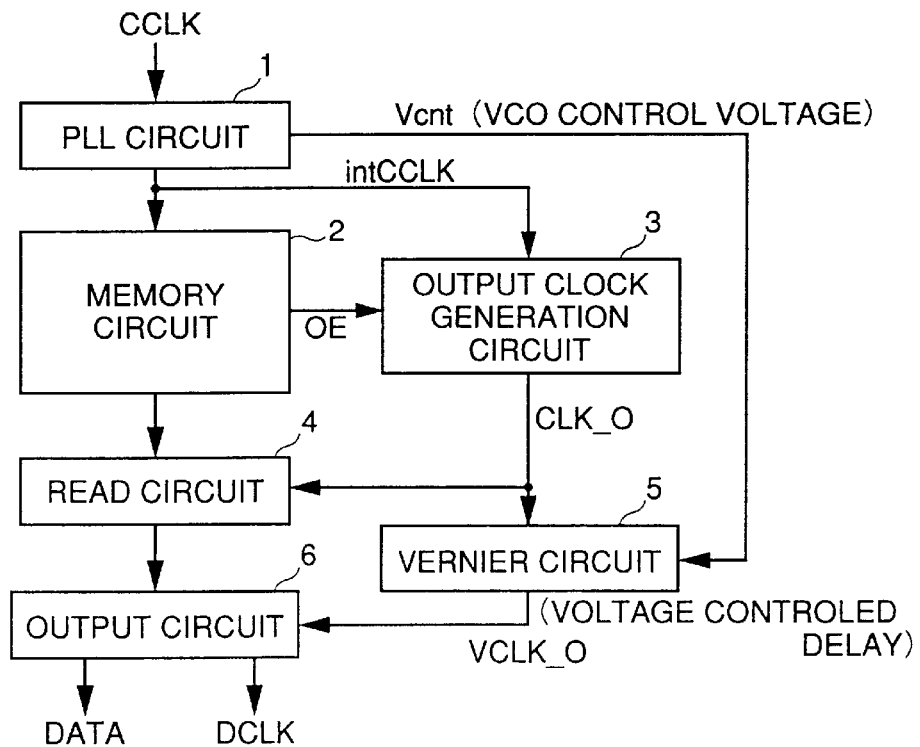
FIG. 1 schematically shows an overall structure of a synchronous type semiconductor memory device according to a first embodiment of the present invention.

FIG. 1 schematically shows an overall structure of a sync link DRAM according to a first embodiment of the present invention. In FIG. 1, the sync link DRAM includes a PLL circuit (Phase Lock Loop circuit) 1 receiving an externally supplied control clock signal CCLK and generating an internal clock signal intCCLK in phase with external control clock signal CCLK, a memory circuit 2 operating in synchronization with internal clock signal intCCLK from PLL circuit 1, and an output clock generation circuit 3 activated in response to an output enable signal OE from memory circuit 2 for generating an output clock signal CLK_O in synchronization with internal clock signal intCCLK when a data read instruction (data read command) is applied.

Memory circuit 2 includes a slave ID register for storing a slave ID, a command decoder for decoding an applied command when the slave ID included in an applied packet coincides with the stored slave ID, a plurality of memory cells, a row/column selection drive circuit for performing an operation as instructed in accordance with a decode signal from the command decoder. When an applied command designates data reading, memory circuit 2 activates output enable signal OE and causes output clock generation circuit 3 to generate output clock signal CLK_O.

Figure 18:
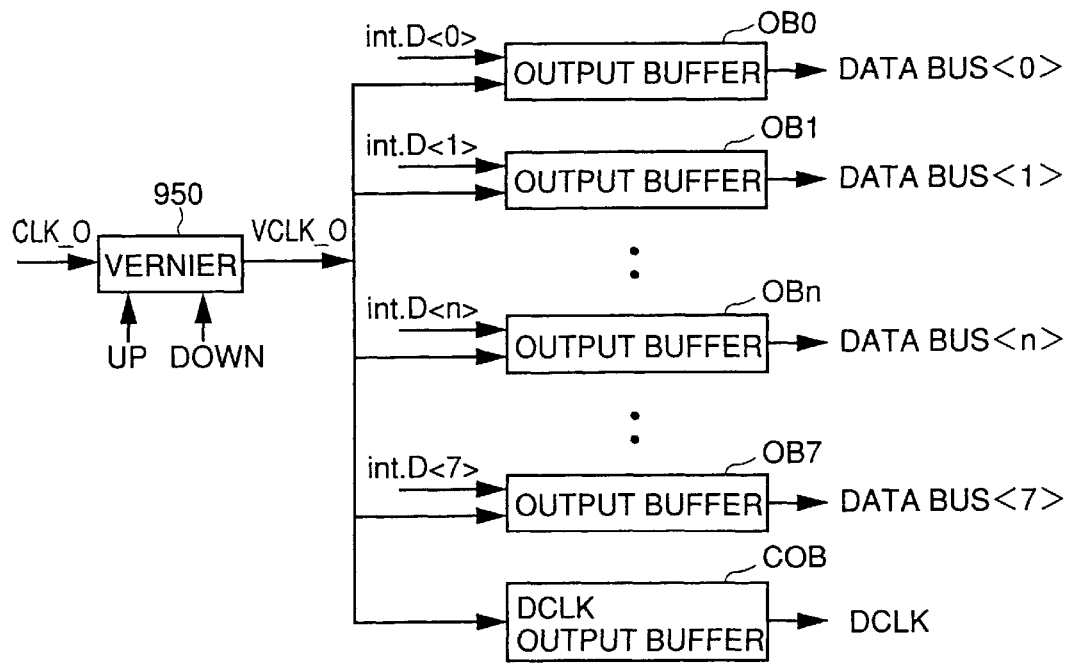
FIG. 18 schematically shows a structure of the data output portion in the conventional sync link DRAM.
Figure 19A:
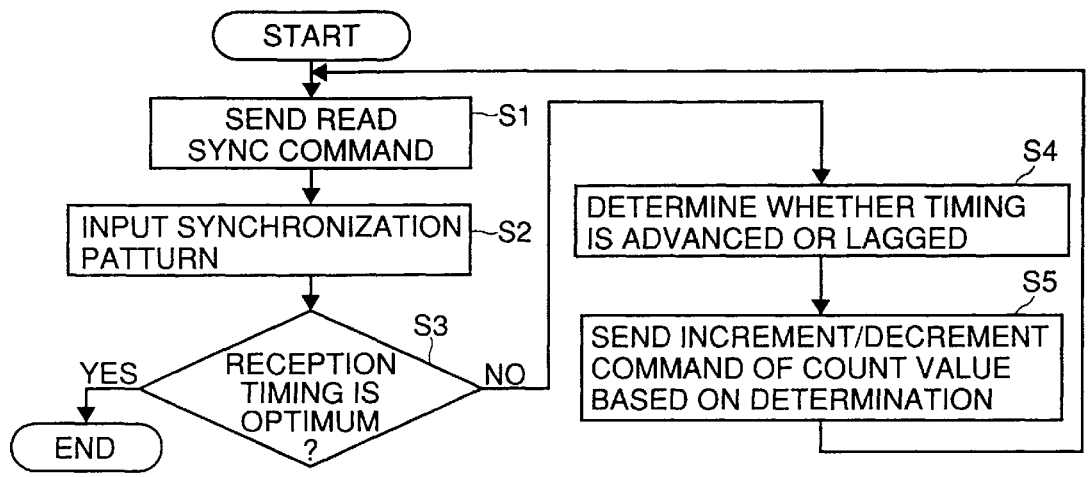
FIG. 19A is a flow chart illustrating vernier setting operation in the conventional memory system.
Figure 19B:
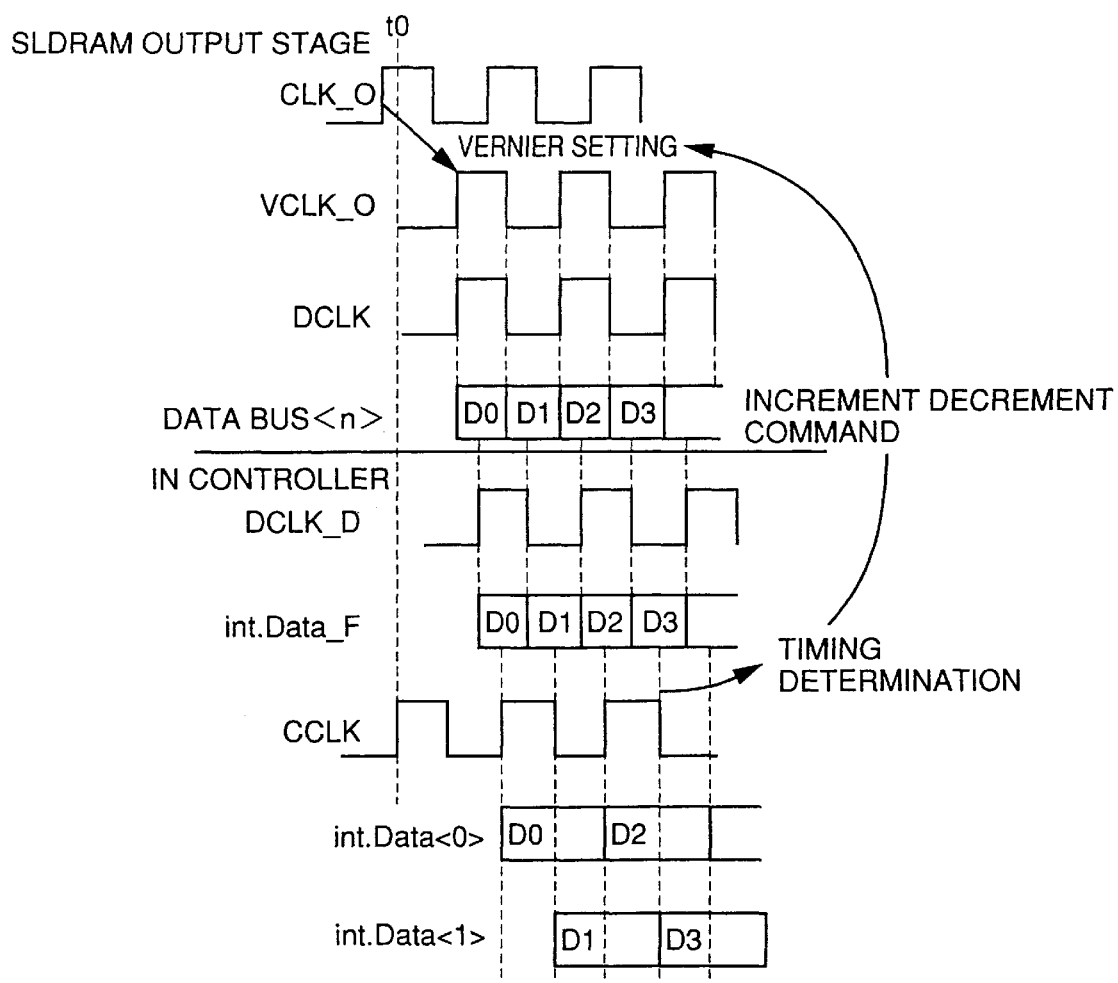
FIG. 19B is a timing chart illustrating the vernier setting action of by the data output portion shown in FIG. 18.

The sync link DRAM further includes a read circuit 4 activated at the time of data reading for reading data of a selected memory cell in memory circuit 2 in a prescribed sequence in synchronization with output clock signal CLK_O, a vernier circuit 5 delaying output clock signal CLK_O from output clock generation circuit 3 by a programmed delay time, and an output circuit 6 activated at the time of data outputting for buffering read data supplied from read circuit 4 and generating external read data DATA and a read clock signal DCLK in synchronization with vernier clock signal VCLK_O from vernier circuit 5. The structure of output circuit 6 is the same as the one shown in FIG. 18. The output circuit 6 has the same structure as the one shown in FIG. 18, and it includes an output buffer provided corresponding to each data bit and operating in synchronization with vernier clock signal VCLK_O, and a buffer circuit for buffering vernier clock signal VCLK_O and generating read clock signal DCLK.

PLL circuit 1 includes a voltage controlled oscillator (VCO) and generates internal clock signal intCCLK in phase with externally supplied clock signal CCLK. When a general clock input buffer is used, delay time in the clock input buffer comes to have a value which is not negligible for a high speed operation. Therefore, internal clock signal intCCLK which is in phase with external control clock signal CCLK is generated by PLL circuit 1 to quicken a timing for starting internal operation to achieve high speed access. PLL circuit 1 generates a control voltage Vcnt which corresponds to a phase difference between external control clock signal CCLK and internal clock signal intCCLK to control the oscillating frequency of the voltage controlled oscillator and match the phases of external control clock signal CCLK and internal clock signal intCCLK with each other.

Figure 2:
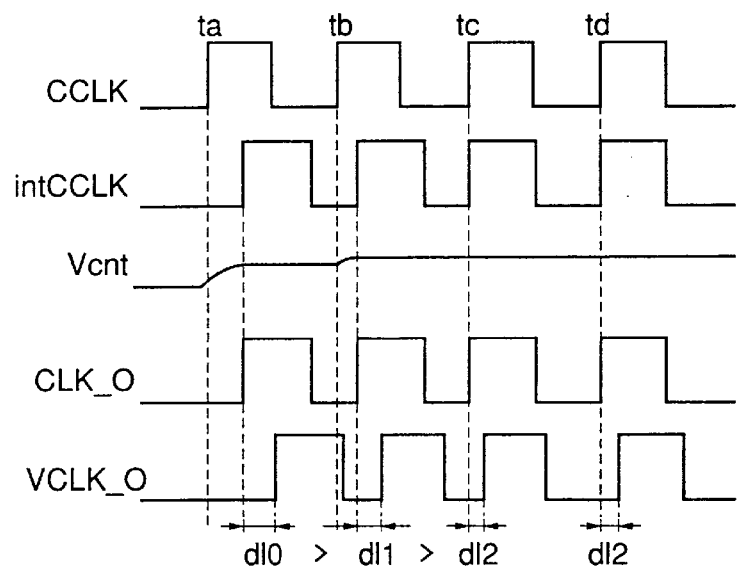
FIG. 2 illustrates the operating principle of a vernier circuit of the synchronous type semiconductor memory device shown in FIG. 1.

Vernier circuit 5 has a similar structure to that of voltage controlled oscillator included in PLL circuit 1. Since an oscillating operation is not necessary for the vernier circuit 5, however, the feedback loop from an output to an input is removed. In order to control the delay amount of the delay circuit (voltage controlled delay circuit) included in vernier circuit 5, control voltage Vcnt is used which is generated in PLL circuit 1. Therefore, in vernier circuit 5 as well, an operating current is adjusted in accordance with the operating characteristics of an MOS transistor which is a component, and thus the delay time is adjusted. Therefore, the delay time is always constant regardless of the operating environment (voltage and temperature, for example). The operation of voltage controlled delay type vernier circuit 5 will be described with reference to a timing chart shown in FIG. 2.

Consider the case in which the phase of internal clock signal intCCLK is delayed with respect to that of external control clock signal CCLK by time ta. This state corresponds to the case in which the oscillating frequency is decreased in PLL circuit 1. In this case, the voltage level of control voltage Vcnt changes (shown to rise in FIG. 2) in accordance with the phase difference, and the oscillating frequency of the voltage controlled oscillator in PLL circuit 1 is increased. Thus, the phase of internal clock signal intCCLK advances. At this time, when output clock generation circuit 3 generates output clock signal CLK_O, the phase of output clock signal CLK_O also changes in synchronization with internal clock signal intCCLK.

In vernier circuit 5, the delay time of the voltage controlled delay circuit is also large, and vernier clock signal VCLK_O has delay time d10 with respect to output clock signal CLK_O. A lower oscillating frequency corresponds to the state in which the operating speed of the voltage controlled oscillator in the PLL circuit becomes slower, and accordingly the operating speed of the voltage controlled delay circuit in vernier circuit 5 is slowed down and the delay time becomes longer.

At time tb, adjustment of the voltage level of control voltage Vcnt reduces the phase difference between external clock signal CCLK and internal clock signal intCCLK in PLL circuit 1. In accordance with control voltage Vcnt, the operating speed is increased and the delay time is shortened to dl1 in the voltage controlled delay circuit of vernier circuit 5 as well. In this case, there still exists the phase difference between control clock signal CCLK and internal clock signal intCCLK and therefore the voltage level of control voltage Vcnt changes (increases in FIG. 2). Thus, the operating frequency is further increased in PLL circuit 1, and the delay time of the voltage controlled delay circuit is also shortened in vernier circuit 5.

At time tc, the phases of external control clock signal CCLK and internal clock signal intCCLK coincide with each other. In this state, the voltage level of control voltage Vcnt does not change. Therefore, external control clock signal CCLK and internal clock signal intCCLK maintains the synchronized state. Accordingly, output clock signal CLK_O from output clock generation circuit 3 is also in phase with internal clock signal intCCLK. The voltage controlled delay circuit in vernier circuit 5 comes to have delay time dl2 through adjustment of the operating speed by control voltage Vcnt. Thereafter, while PLL circuit 1 is locked, the delay time of the voltage controlled delay circuit in vernier circuit 5 does not change (control voltage Vcnt is constant). Therefore, while external clock signal CCLK and internal clock signal intCCLK are locked, there is no change in delay time dl2 of vernier circuit 5.

The delay time dl2 is an initialized delay time. Therefore, even if there causes a change in the operating conditions (voltage and temperature) of the sync link DRAM and the delay time of vernier circuit 5, the delay time of the voltage controlled delay circuit is adjusted in accordance with the phase synchronization operation in PLL circuit 1, and vernier circuit 5 always provides a constant delay time dl2. Therefore, read clock signal DCLK and data DATA can be output at programmed timing, a data input error in the controller can be prevented, and a memory system which is stable and reliable can be structured.

Figure 3:
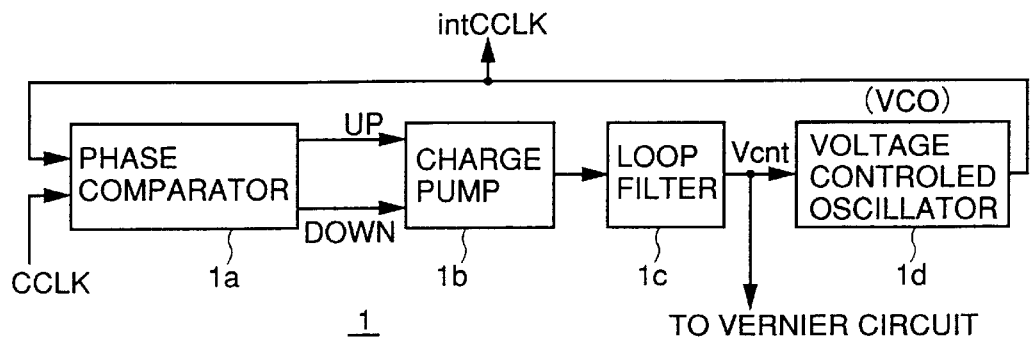
FIG. 3 schematically shows a structure of the PLL circuit shown in FIG. 1.

FIG. 3 schematically shows a structure of PLL circuit 1 shown in FIG. 1. In FIG. 3, PLL circuit 1 includes a phase comparator 1a for comparing the phase of externally supplied control clock signal CCLK and the phase of internal clock signal intCCLK and outputting signals UP and DOWN corresponding to the phase difference, a charge pump 1b for adjusting the charge voltage of a capacitor, not shown, in response to control signals UP and DOWN from phase comparator 1a, a loop filter 1c for filtering the output voltage signal of charge pump 1b and generating control voltage Vcnt, and a voltage controlled oscillator (VCO) 1d having its oscillating frequency controlled by control voltage Vcnt from loop filter 1c and generating internal clock signal intCCLK. Control voltage Vcnt from loop filter 1c is also supplied to the vernier circuit shown in FIG. 1.

Phase comparator 1a activates signal UP when the phase of internal clock signal intCCLK is delayed with respect to that of control clock signal CCLK, and activates signal DOWN when the phase of internal clock signal intCCLK advances with respect to the phase of external control clock signal CCLK. Charge pump 1b includes a circuit for charging and discharging the capacitor, and charges and discharges the capacitor in accordance with signals UP and DOWN. Loop filter 1c filters out the high frequency component of the charge voltage signal of the capacitor to generate control voltage Vcnt which changes relatively moderately.

Voltage controlled oscillator 1d has its operating current adjusted by control voltage Vcnt and generates internal clock signal intCCLK by adjusting the oscillating frequency. Therefore, when the phase of internal clock signal intCCLK advances relatively to the phase of external control clock signal CCLK, the oscillating frequency of voltage controlled oscillator 1d is decreased. On the contrary, when the phase of internal clock signal intCCLK is delayed with respect to the phase of external control clock signal CCLK, the oscillating frequency of voltage controlled oscillator 1d is increased by control voltage Vcnt.

PLL circuit 1 shown in FIG. 3 is structured as a PLL circuit of a unit frequency multiplication. The phases and frequencies of external control clock signal CCLK and internal clock signal intCCLK are both coincide with each other when PLL circuit 1 is locked. Even if there is a change in the operating characteristics of a transistor which is a component of PLL circuit 1 because of a fluctuation of the operating environment, control voltage Vcnt is adjusted such that the phase of internal clock signal intCCLK coincides with the phase of external control clock signal CCLK in accordance with the change. Therefore, the oscillating frequency of voltage controlled oscillator 1d is always constant without being influenced by a change in the operating environment such as temperature and voltage (it coincides with external control clock signal CCLK in phase and frequency).

Figure 4:
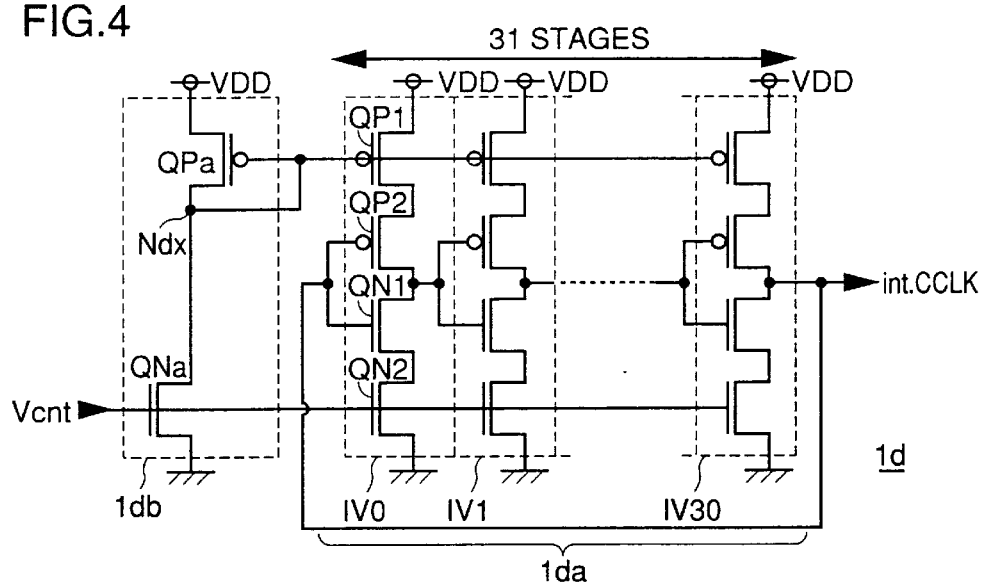
FIG. 4 shows one example of the structure of the voltage controlled oscillator shown in FIG. 3.

FIG. 4 shows a structure of voltage controlled oscillator 1d shown in FIG. 3. In FIG. 4, voltage controlled oscillator 1d includes an oscillation portion 1da including a ring oscillator formed of inverters IV0–IV30 as delay circuits of 31 stages, and a current adjusting circuit 1db adjusting the operating current of inverters IV0–IV30 of oscillation portion 1da in accordance with control voltage vcnt. The discharge current of inverters IV0–IV30 is also controlled by control voltage Vcnt.

Inverters IV0–IV30 have the same structure, and each inverter includes p channel MOS transistors QP1 and QP2 connected in series between a node supplying power supply voltage VDD and an output node, and n channel MOS transistors QN1 and QN2 connected in series between the output node and a ground node. The gate of MOS transistor QN2 is supplied with control voltage Vcnt. Inverters IV0–IV30 are connected in a ring manner, and the gates of MOS transistors QP2 and QN1 are supplied with the output signal of the inverter at the previous stage in each inverter. The input portion of inverter IV0 at the first stage is supplied with the output signal (internal clock signal intCCLK) of inverter IV30 at the last stage (feedback by a feedback loop).

Current adjusting circuit 1db includes a p channel MOS transistor QPa connected between a power supply node and an internal node Ndx and having its gate connected to node Ndx, and an n channel MOS transistor QNa connected between node Ndx and ground node and having its gate receiving control voltage Vcnt. The gate of MOS transistor QPa is connected to the gates of p channel MOS transistors QP1 included in respective inverters IV0–IV30.

In current adjusting circuit 1db, MOS transistor QNa operates as a current source having its drive current adjusted in accordance with control voltage Vcnt. MOS transistors QN2 of inverters IV0–IV30 receive control voltage Vcnt at their gates. When MOS transistors QNa and QN2 have the same size, therefore, inverters IV0–IV30 generate the discharge current having the same magnitude as that of MOS transistor QNa of current adjusting circuit 1db. MOS transistor QPa has its gate and drain interconnected and generates, at its gate, a voltage corresponding to the current flowing in MOS transistor QNa. MOS transistor QPa forms a current mirror circuit with respective MOS transistors QP1 of inverters IV0–IV30. When MOS transistor QPa and MOS transistor QP1 have the same size, therefore, the current having the same magnitude as the current flowing through MOS transistor QPa flows in these MOS transistors QP1. MOS transistor QPa supplies current to MOS transistor QNa. Therefore, MOS transistors QP1 and QN2 equalize the charge current and the discharge current of inverters IV0–IV30 and thus the delay times of a rise and a fall are equalized.

When the voltage level of control voltage Vcnt is lowered, the amount of current driving MOS transistor QNa is reduced, and the amount of the drive current of MOS transistors QN2 is reduced in inverters IV0–IV30 as well. Accordingly, the drive current of MOS transistors QP1 in inverters IV0–IV30 is reduced through MOS transistor QPa. Thus, the charging and discharging speed of inverters IV0–IV30 is reduced and the oscillating frequency of oscillation portion 1da is decreased. On the other hand, when control voltage Vcnt becomes high, the current supplied by current adjusting circuit 1db is increased, and thus the charge and discharge current of inverters IV0–IV30 is increased. The operating speed of inverters IV0–IV30 becomes higher and the oscillating frequency of oscillation portion 1da is increased. Control voltage Vcnt is adjusted in accordance with the phase difference between internal clock signal intCCLK and external control clock signal CCLK.

Figure 5:
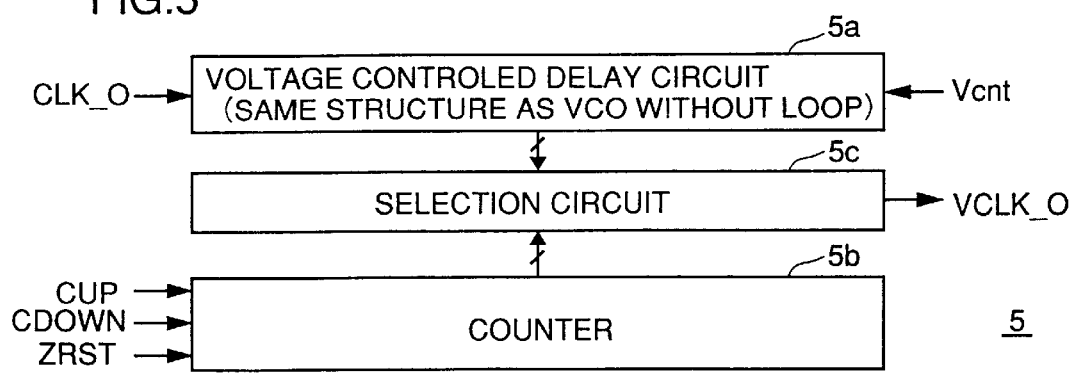
FIG. 5 schematically shows a structure of the vernier circuit shown in FIG. 1.

FIG. 5 schematically shows a structure of vernier circuit 5 shown in FIG. 1. In FIG. 5, vernier circuit 5 includes a voltage controlled delay circuit 5a having the same structure as voltage controlled oscillator 1d except for the feedback loop included in PLL circuit 1 and delaying output clock signal CLK_O, a counter 5b having its count value adjusted in accordance with an increment command CUP, a decrement command CDOWN and reset signal ZRST, and a selection circuit 5c provided between each output bit of counter 5b and each respective delay stage of voltage controlled delay circuit 5a and selecting the output signal of a corresponding delay stage of voltage controlled delay circuit 5a in accordance with the output count value of counter 5b to generate vernier clock signal VCLK_O.

Voltage controlled delay circuit 5a has its operating current adjusted by control voltage Vcnt which is generated in PLL circuit 1. Control voltage Vcnt is so adjusted that the phases and frequencies of internal clock signal intCCLK and external control clock signal CCLK coincide with each other. Voltage controlled delay circuit 5a has the same structure as voltage controlled delay circuit 1d except for the feedback loop. Therefore, the operating characteristics of voltage controlled delay circuit 5a are always set constant in accordance with control voltage Vcnt. Accordingly, the delay time provided by voltage controlled delay circuit 5a is constant regardless of the operating environment.

Selection circuit 5c selects a corresponding output of a delay stage in voltage controlled delay circuit 5a in accordance with the output count bit of counter 5b, so that the delay time of vernier clock signal VCLK_O with respect to internal output clock signal CLK_O is always constant.

Figure 6:
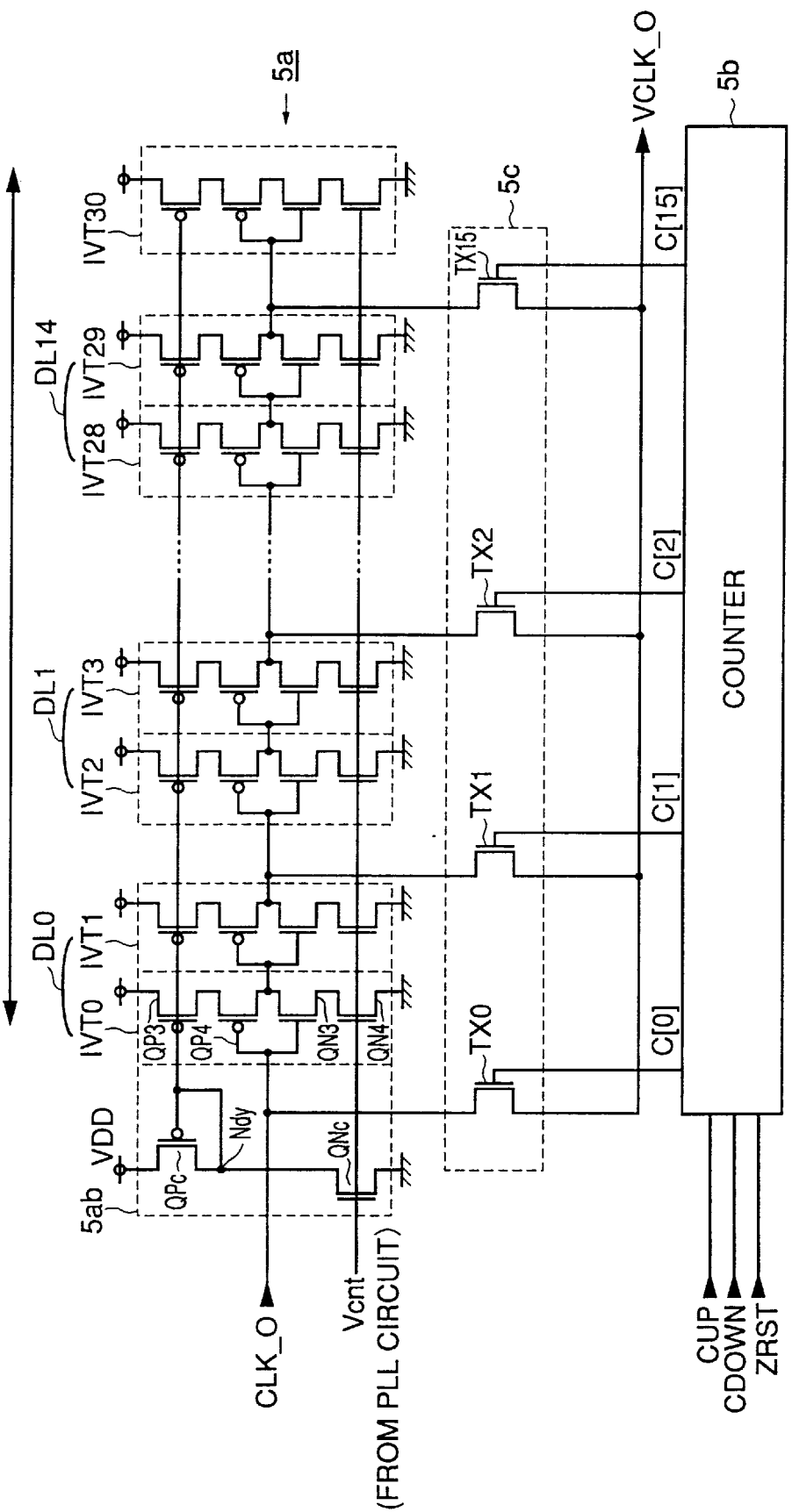
FIG. 6 shows in more detail the structure of the vernier circuit shown in FIG. 5.

FIG. 6 shows a specific structure of voltage controlled delay circuit 5a shown in FIG. 5. In FIG. 6, voltage controlled delay circuit 5a includes inverters IVT0–IVT30 as cascaded delay circuits of 31 stages, and a current adjusting circuit 5ab controlling the operating current (charge and discharge current) of inverters IVT0–IVT30 in accordance with control voltage Vcnt. Inverters IVT0–IVT30 have the same structure as inverters IV0–IV30 of voltage controlled oscillator 1d included in PLL circuit 1 (the size of a transistor and the number of inverter stages are both the same). Inverters IVT0–IVT30 have the same structure. In FIG. 6, reference characters are only given to elements in inverter IVT0.

Inverter IVT0 includes p channel MOS transistors QP3 and QP4 connected in series between a power supply node and an output portion, and n channel MOS transistors QN3 and QN4 connected in series between the output portion and a ground node. The gates of MOS transistors QP4 and QN3 of inverter IVT0 are supplied with output clock signal CLK_O. MOS transistor QN4 receives control voltage Vcnt. MOS transistor QP3 receives a voltage output from current adjusting circuit 5ab.

Output voltage adjusting circuit 5ab includes a p channel MOS transistor QPc connected between a power supply node receiving power supply voltage VDD and a node Ndy and having its gate connected to node Ndy, and an n channel MOS transistor QNc connected between node Ndy and a ground node and having its gate receiving control voltage Vcnt. MOS transistor QPc forms a current mirror circuit with MOS transistors QP3 of inverters IVT0–IVT30. Thus, the charge current and the discharge current are equalized in inverters IVT0–IVT30. Two successively connected inverters form one delay stage. FIG. 6 shows a delay stage DL0 formed of inverters IVT0 and IVT1, a delay stage DL1 formed of inverters IVT2 and IVT3, and a delay stage DL14 formed of inverters IVT28 and IVT29. The output signal of inverter IVT30 is not used. However, inverter IVT30 is provided to implement the same operating characteristics as voltage controlled oscillator 1d of the PLL circuit.

Figure 20A:
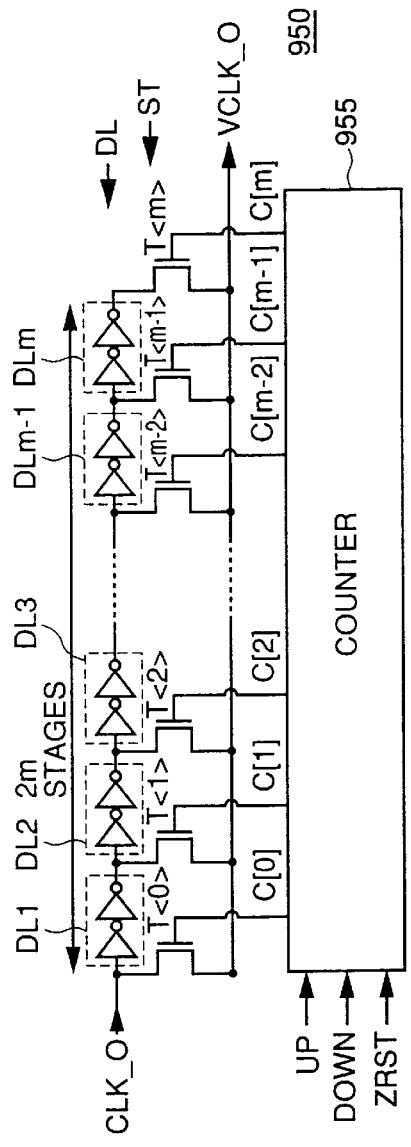
FIG. 20A shows a structure of a possible implementation of the vernier circuit.
Figure 20B:
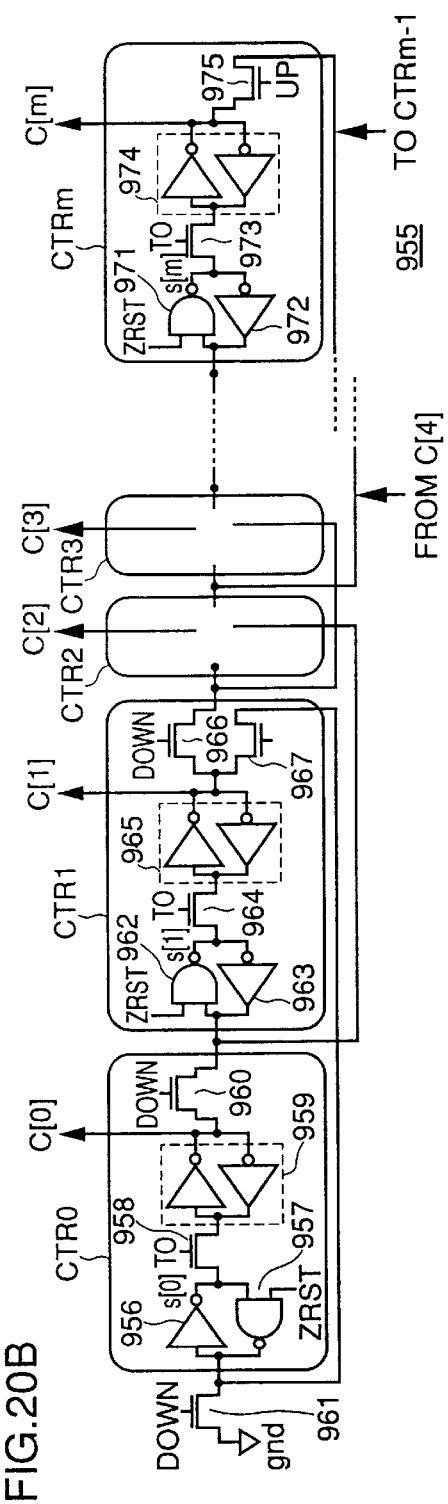
FIG. 20B shows a structure of the counter shown in FIG. 20A.
Figure 20C:
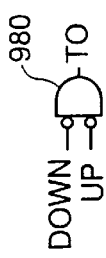
FIG. 20C shows a structure of a transfer instruction signal generation portion.
Figure 21:
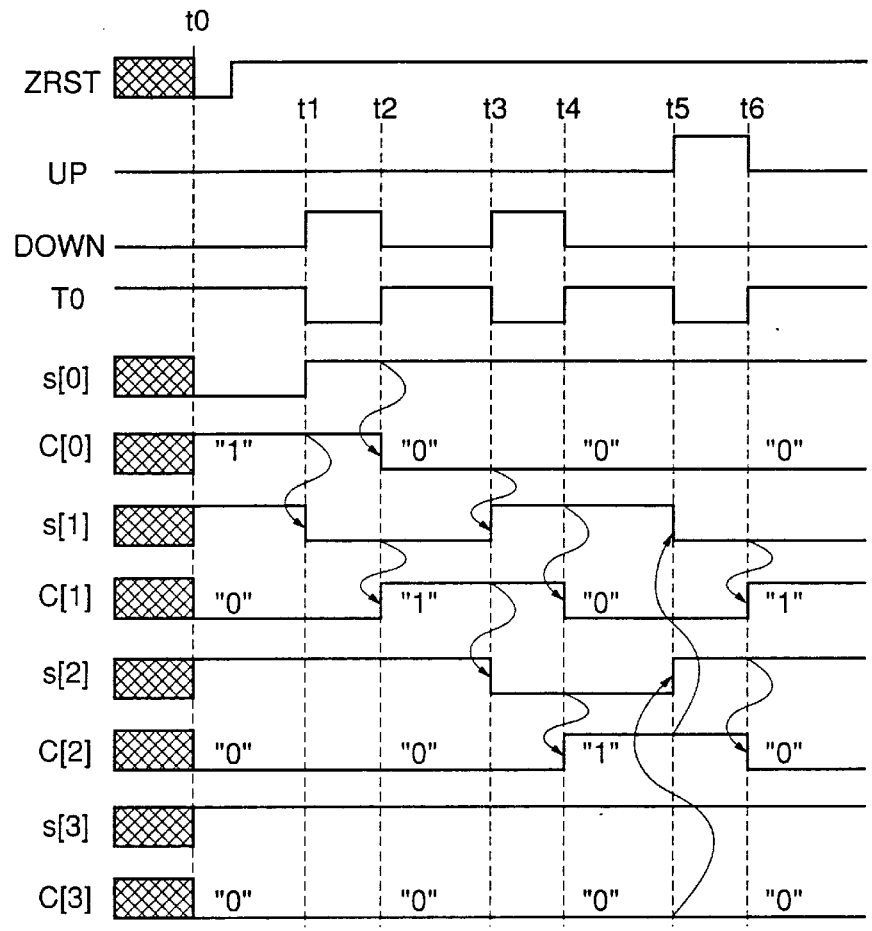
FIG. 21 is a timing chart illustrating the operation of the counter shown in FIGS. 20A–20C.
Figure 22:
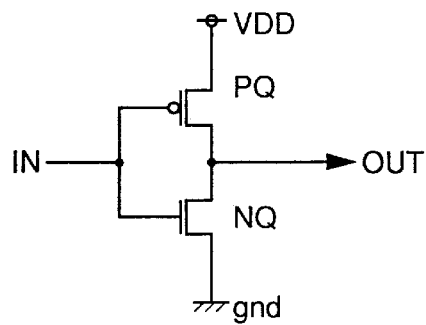
FIG. 22 shows a structure of the inverter shown in FIG. 20A.

Counter 5b includes count bits C[0]–C[15] which correspond to the outputs of the delay stages of voltage controlled delay circuit 5a and to output clock signals CLK_O. Counter 5b activates one of count bits C[0]–C[15] in accordance with a count-up instruction (increment command) CUP, a count-down instruction (decrement command) CDOWN and reset signal ZRST which are externally supplied. Counter 5b has the same structure as the one shown in FIG. 20B. Reference characters CUP and CDOWN are used instead of external commands UP and DOWN in order to make a distinction from the output of the charge pump.

Selection circuit 5c includes transfer gates TX0–TX15 connected between count bits C[0]–C[15] of counter 5b and the output portions of an input stage and delay stages of voltage controlled delay circuit 5a and formed of n channel MOS transistors rendered conductive when corresponding count bits of counter 5b are activated. One of transfer gates TX0–TX15 is rendered conductive in accordance with the output count value of counter 5b, and a corresponding signal is output as vernier clock signal VCLK_O.

Delay stages DL0–DL14 of 15 stages are provided. Therefore, there may be 0 to 15 delay steps for the vernier. PLL circuit 1 is the PLL circuit of a unit frequency multiplication, and delay time $\Delta t$ of an inverter of 1 stage is tCK/2·31. Therefore, the unit delay amount of each of delay stages DL0–DL14 is 2·Δt=tCK/31. Here, tCK represents the period of 1 cycle of external control clock signal CCLK. Therefore, the delay time is from 0 to 15·tCK/31. In this case, delaying up to a half cycle of external control clock signal CCLK is possible. Data is transferred using both of the rising and falling edges of a clock signal. Thus, a half cycle of external clock signal CCLK or read clock signal DCLK is maximum for vernier control. When it is exceeded, the value of read latency is updated by 1 (the latency is defined on the basis of a half cycle (bit time) of external control clock signal CCLK). Therefore, delay time which is necessary can be applied correctly.

The unit delay amount is kept at the value of 1/31 times the cycle of external control clock signal in accordance with control voltage Vcnt regardless of a change in the operating environment such as temperature or voltage. Therefore, the delay amount of each delay stage can be obtained without actual measurement of the delay amount and it implements easy control of the delay amount.

Further, in a memory system using the same system clock, the delay amount of a vernier circuit in each memory (sync link DRAM) can be kept at a constant value regardless of variations of manufacturing parameters. Therefore, the vernier can be set correctly in accordance with the distance from the controller to each sync link DRAM. Further, a delay amount (vernier) of output data which is set once is constant regardless of a change in the operating environment (voltage and temperature), so that a memory system which operates stably can be structured.

Here, the PLL circuit of a unit frequency multiplication is used in the embodiment above. However, a PLL circuit of n frequency multiplication or 1/n frequency multiplication may be employed in accordance with the frequency of a clock signal (the operating speed of a memory) used. Here, n is an integer of at least 1.

In the description above, a sync link DRAM is used as a memory included in the memory system. However, any memory may be used which can input and output data in synchronization with a clock signal. A memory such as a flash memory or a read only memory may be used.

In the embodiment above, the structure of the read vernier is described in which the transition edges of data and a read clock signal coincide with each other. However, a data offset vernier which causes an offset between read clock signal DCLK and data may be provided, as described below, when the read clock transfer line and the data transfer line may have different loads, causing a phase difference between read data and read clock signal DCLK.

Figure 7:
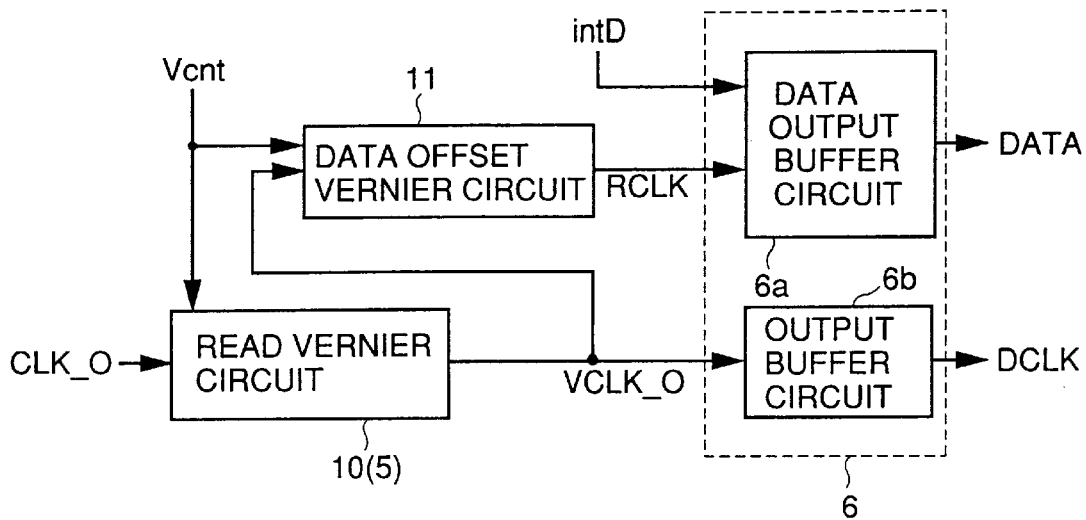
FIG. 7 schematically shows a structure of a main part of a modification of the synchronous type semiconductor memory device shown in FIG. 1.

FIG. 7 schematically shows a structure of an output portion having the data offset vernier. In FIG. 7, the output portion includes a read vernier circuit 10 (5) delaying output clock signal CLK_O by a programmed time period (read vernier), a data offset vernier circuit 11 delaying vernier clock signal VCLK_O from read vernier circuit 10 by a programmed time period, a data output buffer circuit 6a receiving and outputting internal read data intD in synchronization with an output clock signal RCLK from data offset vernier circuit 11, and a DCLK output buffer circuit 6b for buffering vernier clock signal VCLK_O and outputting read clock signal DCLK. These buffer circuits 6a and 6b correspond to output circuit 6 shown in FIG. 1, and read vernier circuit 10 corresponds to vernier circuit 5 shown in FIG. 1.

Data offset vernier circuit 11 delays vernier clock signal VCLK_O by a programmed time period and outputs output clock signal RCLK. Data offset vernier circuit 11 has the same structure to that of read vernier circuit 10, and it includes a similar structure as the voltage controlled oscillator of the PLL circuit which in turn generates the internal clock signal, and has its operating current adjusted in accordance with control voltage Vcnt from the PLL circuit. Therefore, the delay time of data offset vernier circuit 11 is always constant.

Figure 8:
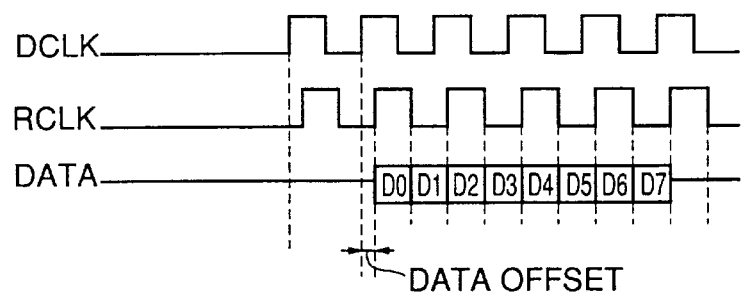
FIG. 8 illustrates the operation of the data offset vernier circuit shown in FIG. 7.

FIG. 8 illustrates the data offset. Data offset vernier circuit 11 delays output clock signal RCLK in accordance with a programmed data offset vernier (delay amount). Data output buffer circuit 6a receives internal read data intD and outputs data DATA in synchronization with output clock signal RCLK. Data DATA from data output buffer circuit 6a is in synchronization with output clock signal RCLK. Therefore, the timing of a change in output data DATA (D0–D7) is offset from the timing of a change in output clock signal DCLK. This offset is called a "data offset". Thus, even if the loads and the propagation delays of a clock signal line and a data transfer line are different, the arrival time at the controller is the same for clock signal DCLK and data DATA.

Figure 9:
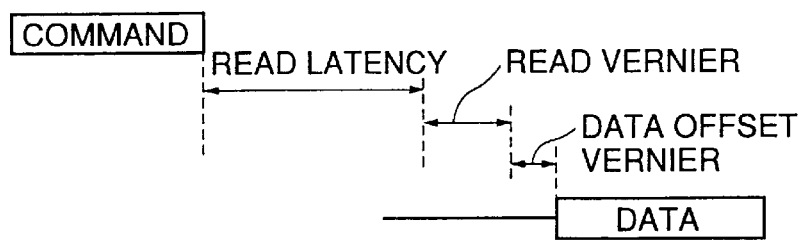
FIG. 9 shows the arrival time of data at the controller.
Figure 10:
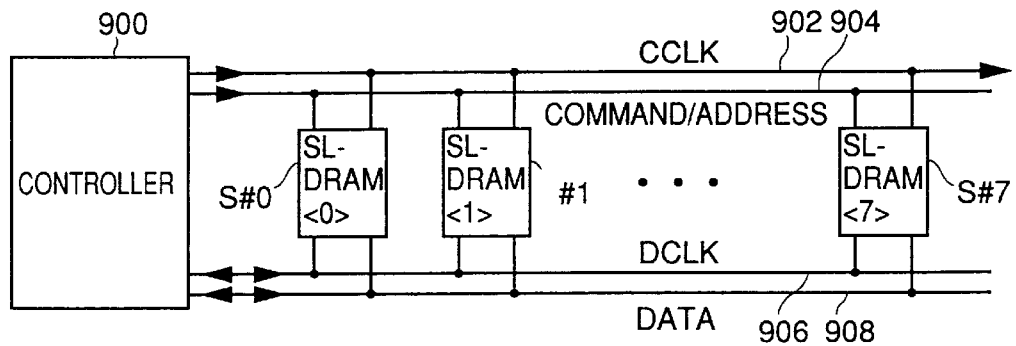
FIG. 10 shows an example of the structure of a conventional memory system using a sync link DRAM.
Figure 11:
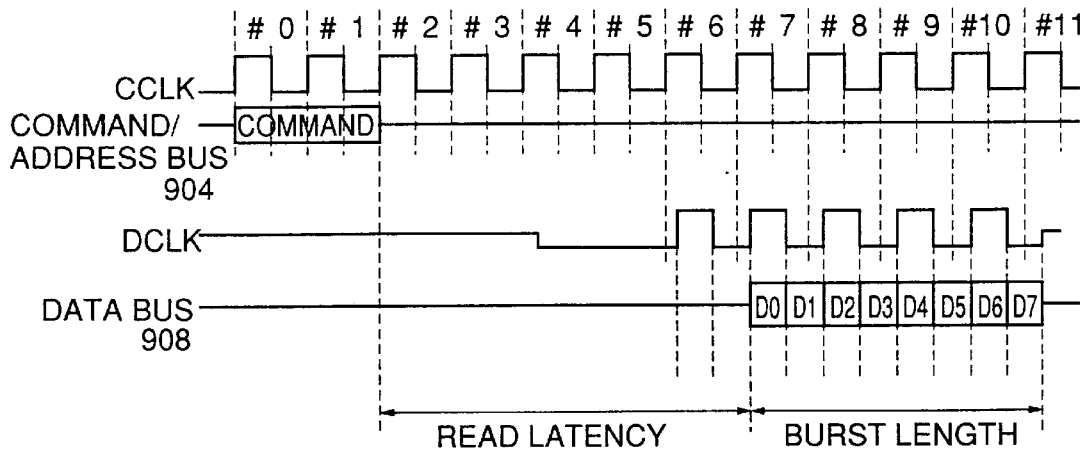
FIG. 11 is a timing chart illustrating the operation of the memory system shown in FIG. 10.
Figure 12:
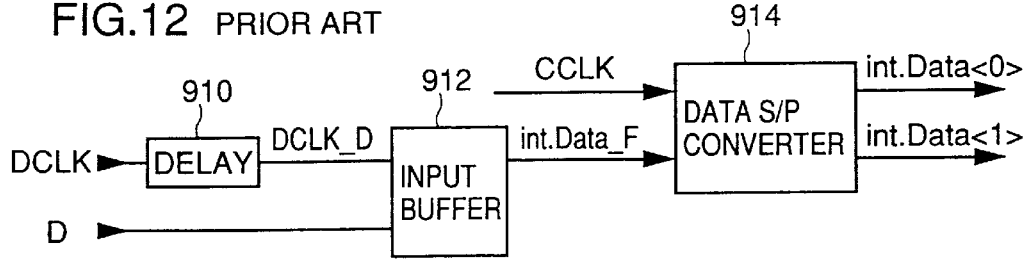
FIG. 12 schematically shows a structure of the data input portion of the controller shown in FIG. 10.
Figure 13:
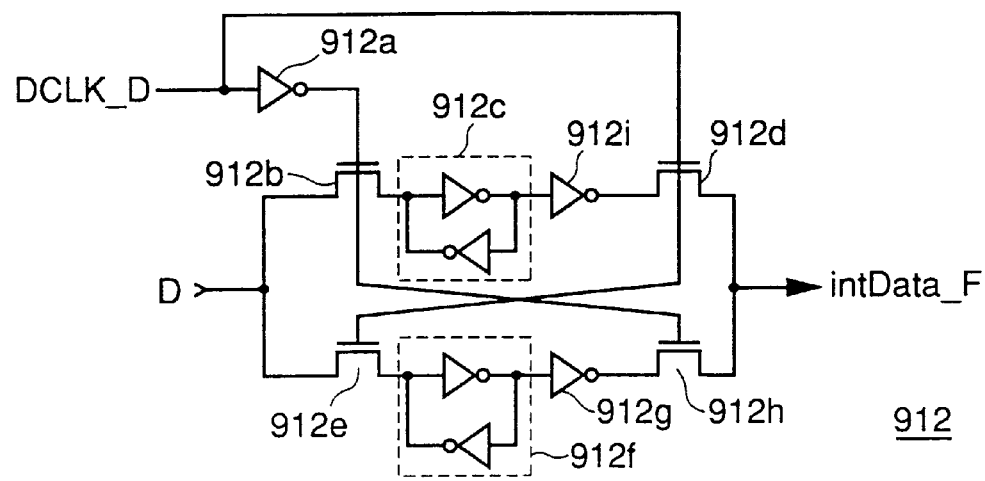
FIG. 13 schematically shows a structure of the input buffer shown in FIG. 12.
Figure 14:
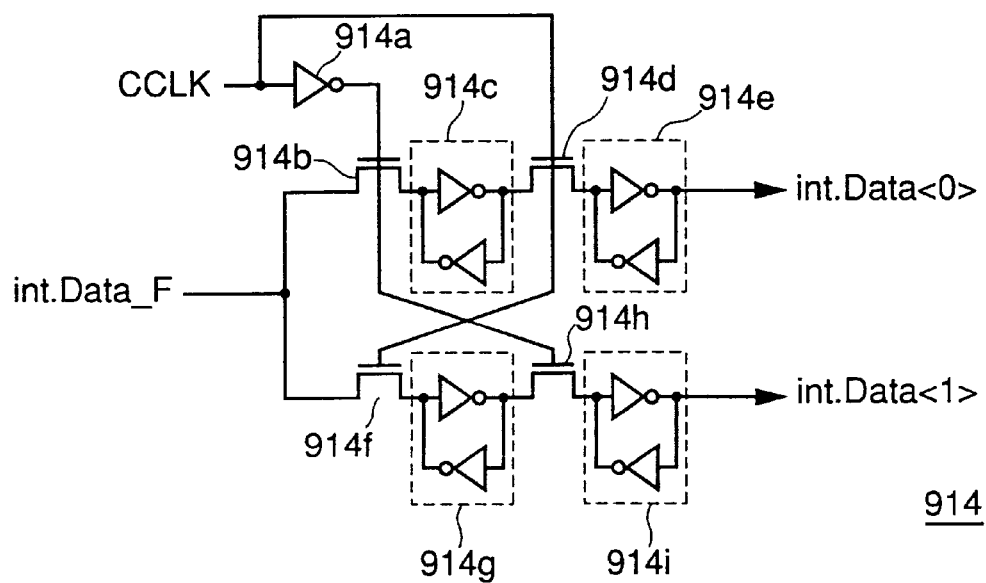
FIG. 14 shows a structure of the data S/P converter shown in FIG. 12.
Figure 15:
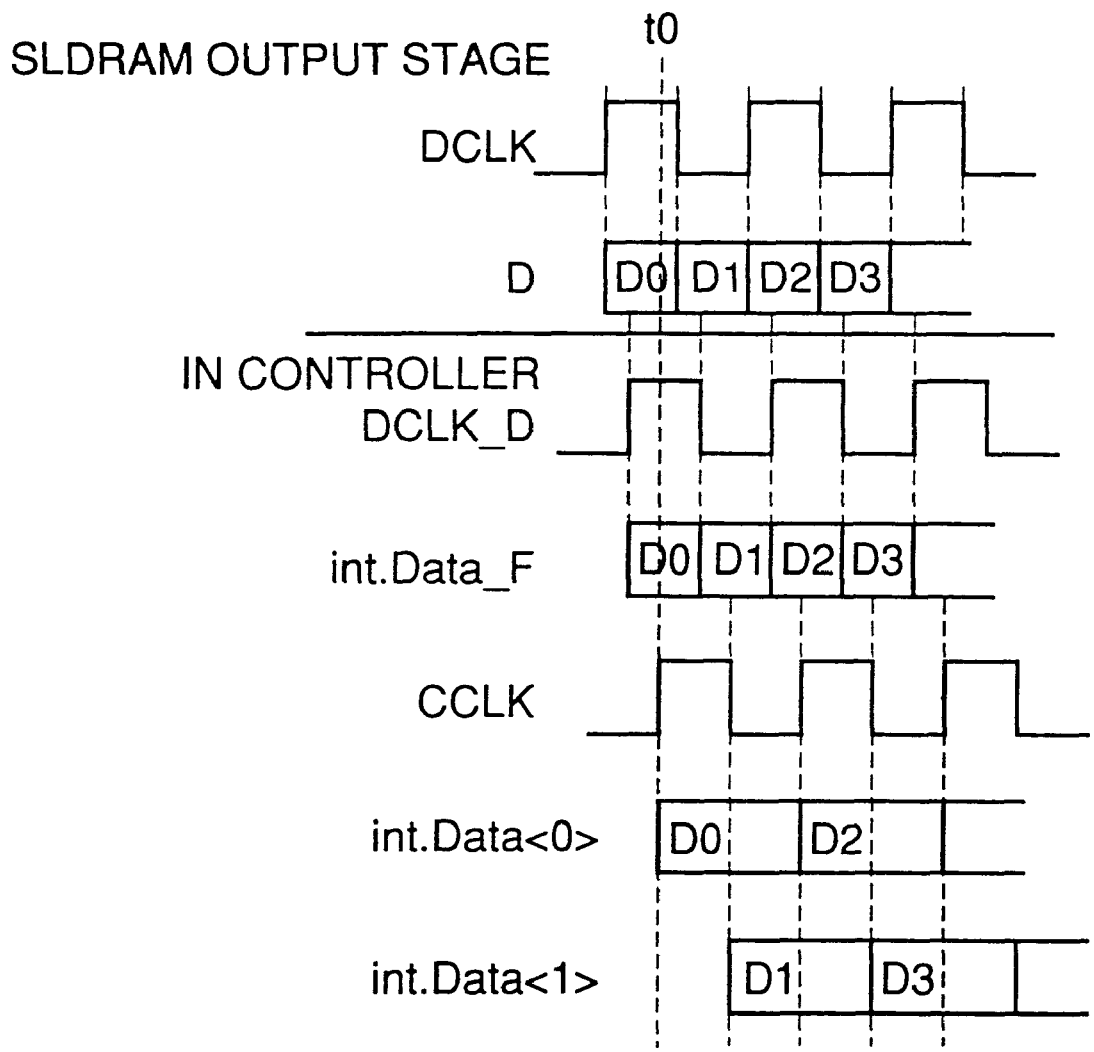
FIG. 15 is a timing chart illustrating the operation of the data input portion of the controller shown in FIG. 12.
Figure 16:
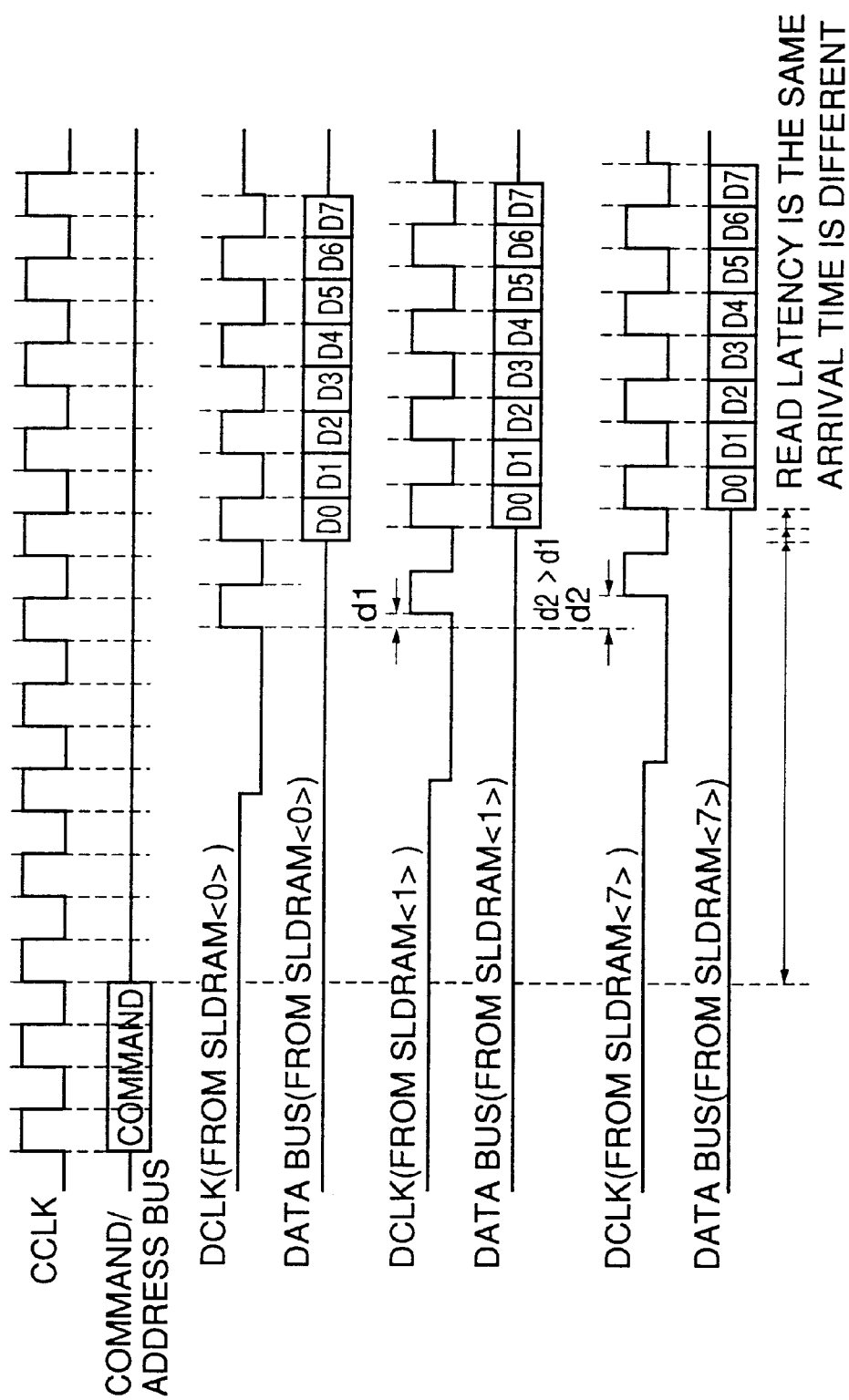
FIG. 16 shows the arrival time of data at the controller in a conventional sync link DRAM system.
Figure 17:
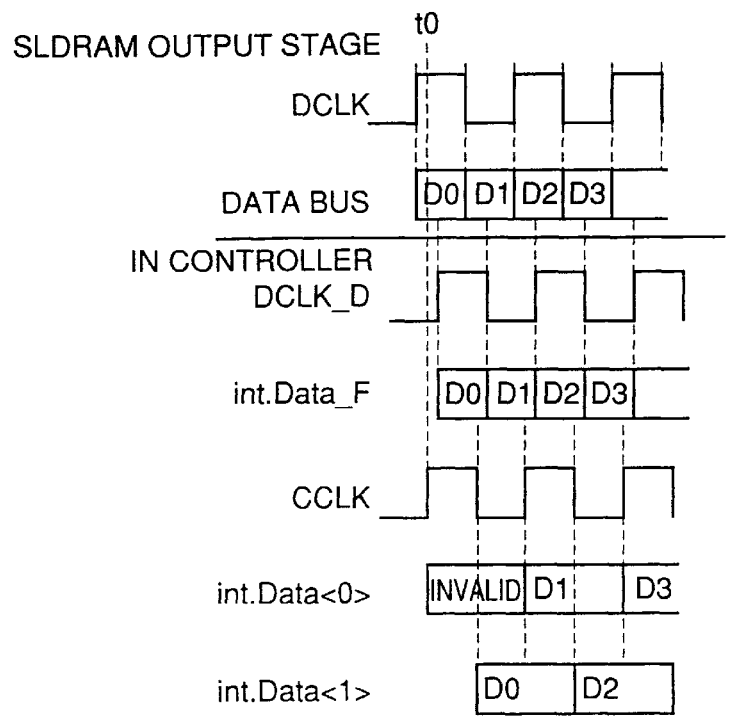
FIG. 17 is a timing chart illustrating a data input error of the controller in the conventional memory system.

As shown in FIG. 9, in the controller, data arrives after the period called "read latency", the read vernier period set by the read vernier circuit, and the data offset vernier period programmed by data offset vernier circuit 11 since a command is sent out.

Even when such data offset vernier circuit 11 is provided, similarly to the read vernier circuit, the delay circuit has the same structure as the voltage controlled oscillator of the PLL circuit except for the feedback loop and the operating current is adjusted in accordance with control voltage Vcnt, so that a voltage controlled delay circuit can be realized which gives a constant delay time regardless of a variation of a control parameter and a change in the operating environment, and thus a stable memory system can be structured. The unit delay amount of variable delay circuit may be set at n times a cycle period of the external clock signal, where n is an odd number larger than or equal to 3.

According to the present invention, the voltage controlled delay circuit having the same structure, except for the loop, as the voltage controlled oscillator included in the PLL circuit which generates the internal clock signal is controlled by the control voltage of the PLL circuit, and the vernier (delay amount) is determined by selecting the output of the voltage controlled delay circuit, so the delay amount of the vernier having optimized timing for inputting data by the controller is kept constant regardless of a change in the operating environment, and a memory system which operates stably can be realized. Further, since the voltage controlled delay circuit having the same structure as the voltage controlled oscillator of the PLL circuit is used, the unit delay amount of the vernier is given by a constant ratio of an external clock signal cycle. Therefore, the unit delay amount can be identified without actual measurement, and a desired unit delay amount can easily be set when designing a circuit. Further, since the unit delay amount of the vernier is given by a ratio of an external clock signal cycle, the vernier delay amount of each memory device in the memory system is constant regardless of a variation of the process, and a memory system which is correctly operates stably can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous type semiconductor memory device, comprising:

a phase synchronization circuit for generating an internal clock signal synchronized in phase with an externally supplied external clock signal, said phase synchronization circuit including a voltage controlled oscillator having a feedback loop from an output portion thereof to an input portion thereof and having an oscillating frequency controlled by a control voltage corresponding to a phase difference between said external clock signal and said internal clock signal;

a read clock generator for generating a read clock signal from said internal clock signal for external outputting when data is read, said read clock generator including a variable delay circuit having a same structure as said voltage controlled oscillator except for said feedback loop and receiving a signal corresponding to said internal clock signal at an input portion thereof; and a vernier setting circuit for setting a delay amount of said variable delay circuit in accordance with an external command.

2. The synchronous type semiconductor memory device according to claim 1, wherein said voltage controlled oscillator includes a plurality of cascaded delay circuits each having an operating current controlled by said control voltage, and an input at a first stage and an output at a last stage of said plurality of delay circuits are connected by said feedback loop, and said variable delay circuit includes a plurality of cascaded second delay circuits of a same number as the plurality of delay circuits of said voltage controlled oscillator, each second delay circuit having an operating current controlled by said control voltage, and a selection circuit selecting an output signal of said plurality of second delay circuits in accordance with an output signal of said vernier setting circuit for outputting as said read clock signal.

3. The synchronous type semiconductor memory device according to claim 1, wherein a unit delay amount of said variable delay circuit is set at 1/m times one cycle period of said external clock signal, in which m is an odd number of at least 3.

4. The synchronous type semiconductor memory device according to claim 2, wherein each second delay circuit of said variable delay circuit is formed of inverters, and said selection circuit selects one of an input clock signal at the input portion thereof and outputs of inverters at even stages in accordance with the output signal of said vernier setting circuit.

5. The synchronous type semiconductor memory device according to claim 2, wherein said vernier setting circuit includes a multi-bit up/down counter having its count value of multi-bits increased and decreased, and said selection circuit includes a gate circuit provided corresponding to each bit of said multi-bit up/down counter for selecting an output of the second delay circuits in response to the multi-bits.

6. The synchronous type semiconductor memory device according to claim 5, wherein said multi-bit up/down counter has each bit corresponding to an integer times said unit delay amount and functions as a shift circuit having a bit out of the multi-bits to be activated at a time, and said gate circuit includes a transfer gate arranged between each output portion of the second delay circuit corresponding to an integer multiple of said unit delay amount and an output node outputting the read clock signal and corresponding to each bit of said multi-bit up/down counter and rendered conductive when a corresponding bit of the multi-bits is activated for connecting the output portion of a corresponding second delay circuit to said output node.

7. The synchronous type semiconductor memory device according to claim 3, wherein said variable delay circuit includes delay circuits each formed of inverters, and said selection circuit selects one of an input clock signal at the input portion thereof and outputs of inverters at even stages in accordance with an output signal of said vernier setting circuit.

8. The synchronous type semiconductor memory device according to claim 1, wherein said read clock generator receives a clock signal generated from said internal clock signal when data is read.

9. The synchronous type semiconductor memory device according to claim 1, further comprising data offset vernier circuitry including a variable delay circuit having a same structure as the voltage controlled oscillator except for the feedback loop, for generating a data output clock signal from the read clock signal, and data output circuitry for externally outputting read data in synchronization with said data output clock signal.

* * * * *